(12) United States Patent
Tolt

(10) Patent No.: US 7,453,705 B2
(45) Date of Patent: Nov. 18, 2008

(54) BARRIER, SUCH AS A HERMETIC BARRIER LAYER FOR O/PLED AND OTHER ELECTRONIC DEVICES ON PLASTIC

(75) Inventor: Zhidan L. Tolt, San Jose, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 11/581,097

(22) Filed: Oct. 13, 2006

(65) Prior Publication Data

US 2007/0031674 A1    Feb. 8, 2007

Related U.S. Application Data

(62) Division of application No. 10/431,990, filed on May 7, 2003, now abandoned.

(60) Provisional application No. 60/378,708, filed on May 7, 2002.

(51) Int. Cl.
*H05K 1/18* (2006.01)

(52) U.S. Cl. .............. 361/762; 361/761; 361/760; 361/792; 361/793; 361/807; 361/809; 361/816

(58) Field of Classification Search ............ 361/762, 361/761, 792, 793, 807, 809, 816
See application file for complete search history.

(56) References Cited

U.S. PATENT DOCUMENTS

| 4,643,950 | A | * | 2/1987 | Ogura et al. ................. 428/446 |
| 4,921,811 | A |   | 5/1990 | Watanabe et al. |
| 5,037,777 | A |   | 8/1991 | Mele et al. |
| 5,315,486 | A | * | 5/1994 | Fillion et al. ................. 361/795 |
| 5,703,755 | A | * | 12/1997 | Flesher et al. ............... 361/737 |
| 6,207,271 | B1 | * | 3/2001 | Daroux et al. ............... 428/344 |
| 6,259,408 | B1 | * | 7/2001 | Brady et al. .......... 343/700 MS |
| 7,105,365 | B2 | * | 9/2006 | Hiroki et al. ................. 438/14 |
| 2001/0000943 | A1 | * | 5/2001 | Fukuoka et al. ............. 313/503 |
| 2002/0098628 | A1 | * | 7/2002 | Hamada et al. ............. 438/149 |
| 2003/0206332 | A1 | * | 11/2003 | Yamazaki et al. ........... 359/312 |

* cited by examiner

*Primary Examiner*—Dean A. Reichard
*Assistant Examiner*—Hoa C Nguyen
(74) *Attorney, Agent, or Firm*—Blakely, Sokoloff, Taylor & Zafman LLP

(57) ABSTRACT

A protective layer for an electronic device and devices with a protective layer. In one exemplary embodiment, the protective layer includes two different layers which can be etched by the same etchant as which are at least one of optically or RF transparent.

7 Claims, 1 Drawing Sheet

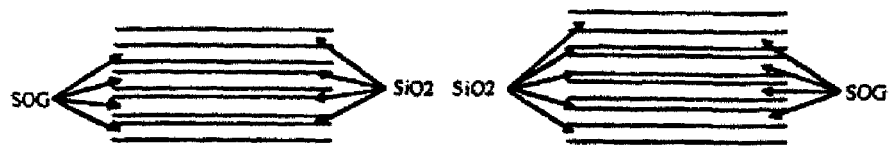
FIG. 1A  FIG. 1B
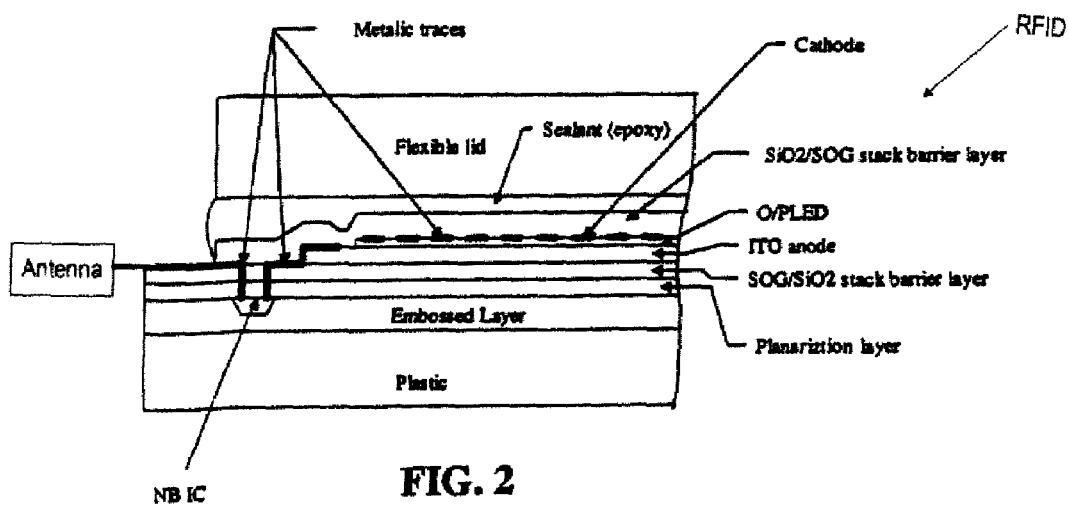
FIG. 2

BARRIER, SUCH AS A HERMETIC BARRIER LAYER FOR O/PLED AND OTHER ELECTRONIC DEVICES ON PLASTIC

This application is a divisional of U.S. patent application Ser. No. 10/431,990 filed on May 07, 2003 now abandoned, which is related to and claims the benefit of the filing date of U.S. provisional Patent Application Ser. No. 60/378,708, filed May 7, 2002. Both the provisional Patent Application 60/378,708 and the Non-Provisional Application Ser. No. 10/431,990 are hereby incorporated herein by reference.

BACKGROUND

Organic or polymer light emitting device, O/PLED, may be used in building displays on flexible plastic film. The low work function metal cathode as well as the organic/polymer media used in these devices degrade extremely fast when exposed to O2 or H2O (oxygen or water). It becomes an especially severe problem when the device is built on a plastic substrate because of high permeability of O2/H2O through it. Therefore, to build a flexible display on plastic with a meaningful lifetime, a transparent hermetic barrier layer coating on the substrate becomes indispensable. A similar problem exists for RF (radio frequency) ID (identification) tags which use an antenna and an IC (integrated circuit), which may be a small block referred to as an NB disposed in a substrate which supports the antenna. In the case of an RF ID tag, it is desirable to attach an IC (which includes the RF receiving and transponding circuitry and the ID information, such as a serial number) and an antenna to a flexible (e.g. plastic) substrate which can then be attached to a product. Any seal or barrier layer should be RF transparent (otherwise the tag will not receive and transpond).

In addition to O/PLED display, many electronic devices, such as organic transistor or LCD displays, are or will be built on flexible plastic substrate in the future. These devices are also sensitive to H2O, O2, or other materials in the environment, and need a transparent barrier on plastic for protection.

Many transparent barrier materials suffer from the formation of pinholes during deposition. It is desirable to have a transparent barrier material that is resistant to the formation of pinholes through the entire barrier (particularly since the pinholes tend to propagate in the barrier material).

Many transparent barrier materials have a substantial content of organic materials, which can suffer from instability when exposed to ultraviolet or visible light, or oxidative materials such as ozone. It is advantageous to have a transparent barrier material with little or no content of organic materials, or to use organic materials that are insensitive to irradiation and oxidation.

Finally, in certain applications it is desirable that there is an easy means to pattern a transparent barrier layer. For example, if one wants to make an electrical connection or via through a barrier layer there must be some way to etch the barrier selectively. To date, many of the transparent barrier layer materials are not easily etchable with conventional wet and dry etch chemistry. An example in the art of a transparent barrier layer used for O/PLED devices is represented by so a called "Vitex" film, which is typically a multi-stack of plastic/Al2O3 layers. Several problems are associated with this type of barrier film. First, it is difficult to either wet or dry etch through the film, making it difficult to form electrical contacts through it. For a display backplane which contains many ICs, where many vias have to be made through the barrier layer for contacts between the ICs and electrodes, or, for a top O/PLED barrier layer, where electric contacts have to be made between electrodes and power supplier after barrier deposition, dry etching through Vitex is challenging. It would require either expensive high-energy plasma equipment or corrosive Chlorine containing gases. Second, it tends to form bubbles when the film is extensively exposed to UV/Ozone or O2 plasma due to decomposition of the plastic layer in the stack. Since UV/Ozone or O2 plasma exposure are the most effective means to clean ITO anode before the spinning of a hole transport layer, achieving a properly cleaned ITO surface without compromising the integrity of the underlying Vitex layer becomes very difficult.

BRIEF DESCRIPTION OF THE FIGURES

FIG. 1A shows an exemplary SOG/SiO2 barrier layer stack;

FIG. 1B shows an exemplary SiO2/SOG hermetic barrier layer stack;

FIG. 2 shows an application of transparent SOG/SiO2 or SiO2/SOG hermetic barrier layer stack in an O/PLED device.

DESCRIPTION OF EXEMPLARY EMBODIMENTS OF THE INVENTION

In an exemplary embodiment, a multi-layer stack of SOG/SiO2 or SiO2/SOG layers with SiO2 as the top layer serves as an effective hermetic barrier layer for O/PLED or other devices on plastic. SOG (spin on glass) can be spun on with a typical thickness of 500 A to 5 micrometers, and SiO2 (silicon dioxide) can be applied by sputtering or other means, with a typical thickness of less than 5 micrometers. Both SOG and SiO2 are highly transparent in visible light. A perfect SiO2 film itself is an effective hermetic barrier layer. Unfortunately it is inevitable to have defects such as pinholes in SiO2 films regardless of deposition method, through which O2 and H2O can effortlessly penetrate. Spinning on SOG can effectively block these pinholes. A multi-layer stack of such double layers should result in an effective hermetic barrier. In most cases, the stack will start with SOG and end with SiO2. There is no requirement that all the layers be the same thickness, and the top SiO2 can be thicker than intermediate layers of SiO2. When the layer to be covered is sensitive to organic solvent or prone to oxidation, such as O/PLED material or cathode metal Ca and Al, the stack can start with a thicker SiO2 layer, 1200 A to 2000 A, for example, to protect the underlying material. A typical thickness for SOG and SiO2 would be 1500 A and 800 A respectively, and the thicker top or bottom SiO2 2000 A. Often, a plastic substrate is defective in pitting and particles, which is detrimental to O/PLED and other devices. In this case, an as thick as is needed SOG layer can be applied first to planarize the surface or cover the defects. FIGS. 1a) and b) show two typical such stacks to be used as a barrier layer.

Although there are many types of SOG materials that are transparent after being cured, it is however preferred to choose the ones that have low shrinkage upon cure and are highly crack resistant, for example, the methylsiloxane family of polymers. Typically, a SOG material requires a much higher curing temperature than a plastic substrate can withstand. However, for this application, an SOG layer may be cured at a much lower temperature, for example 150 C, with longer baking time, or, at room temperature with IR lamp radiation, and the resulting film is adequate for the application. The higher the curing temperature, the lower the water and organic content.

There are many benefits from a barrier layer of the invention. Such a hermetic layer is easy and economic to produce.

SOG can be easily applied by many ways such as spinning, dipping, printing, slot coating, or exposure to mist. SiO2, one of the most commonly used thin films in the semiconductor industry, can be applied by sputtering, evaporation or various CVD processes. Cured or partially cured SOG is largely siloxane. It has excellent adhesion to SiO2 surfaces and is known for its excellent gap filling capability. The combination of SOG/SiO2 is already widely used in the semiconductor industry as an effective planarization layer. The Stack (e.g. SOG/SiO2/SOG/SiO2) can be readily dry etched by conventional fluorocarbon-containing plasmas with a controllable sidewall profile, which is useful to make a good electrical contact through vias, or by wet etch with HF containing solution. Since the entire stack is largely made of inorganic material, the decomposition of organic material upon exposure of UV/Ozone or plasma (resulting bubbles in barrier), is also eliminated.

Example of an Embodiment

FIG. 2 depicts a sample application of the transparent SOG/SiO2 or SiO2/SOG stack as hermetic barrier layers in an O/PLED device. A barrier stack of SOG/SiO2 with a thick SiO2 topping is applied on top of a planarization layer to prevent O2/H2O penetrating from the plastic substrate. An IC is buried in the plastic and connected to metallic electrodes through the barrier layer. On top of the cathode, a barrier stack of SiO2/SOG with a thick SiO2 Bottom is applied to prevent O2/H2O penetration from the top lid. At a perimeter of the device the top barrier layer is removed by etching to expose the metallic contacts for external control and power supply. It should be noted that the top barrier layer can also be replaced by other non-transparent barrier materials that are easily available. Nevertheless, there are top emitting O/PLED structures in which a transparent barrier deposited onto the cathode would be desirable. This barrier material system can be effective as either a laminant applied to the O/PLED film, or as a barrier applied directly on top of the cathode material.

Discussion of Other Exemplary Embodiments

Depending on application, the SOG and SiO2 layer described here can be replaced by numerous materials that should be well known to one skilled in the art. Any inorganic, or a partial inorganic and partial organic material that can be applied to a surface in a liquid form and subsequently cured to become a solid thin film can replace SOG, for example, spin on AlN, ITO, ZnO or PZT film or even spin on metal film. Matching of thermal expansion coefficient to reduce barrier cracking is made possible by adjusting the organic content of the final film. Possible ways of controlling it include, but are not limited to, changing the length of the hydrocarbon branch on the precursor molecule of the pre-spin solution or the extent of film curing. The longer the branch, the more organic the film is, and the more it is cured, the less organic it is. The SiO2 layer can be replaced by any ceramic or metallic film that can be deposited by physical or chemical vapor deposition, such as Silicon Nitride, SiOx, Silicon Oxynitride or Chromium, Aluminum et al.

Such barrier can be applied to many applications beyond O/PLED and electronic devices on plastic. Packaging is one of the examples. The combination of the SOG material and the vapor deposited film can be chosen such that the barrier layer not only prevents H2O/O2 penetration, but also possesses other functionality. For example, a combination of SOG ITO and sputtered ITO makes a barrier that is conductive and can be used for electric and magnetic shielding, or, a combination of SOG PZT and sputtered PZT makes a barrier that is also ferroelectric or even electro-optically active, et al. It is also possible to use different SOG and vapor deposited material for each layer to tailor the reflective index profile within the stack so that the entire barrier is also antireflective.

One aspect of an embodiment of the invention is that the layers, which are used to make a protective sealant (e.g. a hermetic barrier), are different enough (e.g. in their structure) so that pinholes do not propagate but they are similar enough (e.g. in their chemical composition) so that uniform etchants may be used for both layers in the multi-layer stack. For example, SOG and SiO2 are different enough structurally such that pinholes do not propagate but the same etch may be used to etch both, thus making the formation of vias.

Another aspect of an embodiment of the invention is that the layers are inorganic and allow for the use of common etchants and yet prevent the propagation of pinholes.

Another aspect of an embodiment of the invention is that the layers provide a flexible, optically transparent sealant which is substantially impermeable to contaminants such as O2 or H2O. Further, the layers in one embodiment (e.g. SOG/SiO2 layers) provide a flexible, RF transparent sealant (e.g. for use with RF ID tags) which is substantially impermeable to contaminants such as O2 or H2O.

It will be appreciated that certain embodiments of the invention may use 3 layers repetitively (as opposed to the 2 layers of SOG/SiO2 repetitively). Other modifications can be appreciated in view of this description.

What is claimed is:

1. An assembly for an electronic device comprising:
   a plastic substrate suitable for supporting at least one integrated circuit;
   a planarization layer formed over the plastic substrate and the integrated circuit;
   a hermetic barrier layer formed on top of the planarization layer, said hermetic barrier layer comprising at least one first layer and at least one second layer creating a hermetically sealed region,
   wherein the hermetic baffler layer is configured for metallic electrodes to be connected to the integrated circuit that is incorporated into said electronic device comprising a Radio Frequency Identification Tag (RFID tag); and
   wherein the first and second layers are different, and wherein the hermetic layer preventing $O_2$ and $H_2O$ penetration from the plastic substrate.

2. The assembly for an electronic device as in claim 1 wherein said hermetic barrier layer is a topmost layer which is exposed to the earth's atmosphere and wherein the first and second layers can be etched by the same etchant.

3. The assembly for an electronic device as in claim 1 wherein said hermetic barrier layer is at least one of(a) optically transparent or (b) RF transparent.

4. The assembly for an electronic device as in claim 1 wherein said hermetic barrier layer has at least one SOG layer that blocks formation of pin-holes.

5. The assembly for an electronic device as in claim 4 wherein said SOG layer comprises a material that is transparent after cure, has low shrinkage and is highly crack resistant.

6. The assembly for an electronic device as in claim 1 wherein said integrated circuit is buried within the plastic substrate.

7. The assembly for an electronic device as in claim 1 wherein an antenna is attached to said integrated circuit and both the antenna and the integrated circuit are covered and protected by the hermetic baffler layer.

* * * * *